(12) United States Patent
Apel et al.

(10) Patent No.: US 8,748,255 B2
(45) Date of Patent: Jun. 10, 2014

(54) METHOD OF MANUFACTURING AN ELECTROSTATIC PROTECTION DEVICE

(75) Inventors: Thomas R. Apel, Portland, OR (US); Jeremy R. Middleton, Beaverton, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/523,766

(22) Filed: Jun. 14, 2012

(65) Prior Publication Data
US 2012/0260477 A1   Oct. 18, 2012

Related U.S. Application Data

(62) Division of application No. 10/931,495, filed on Aug. 31, 2004, now Pat. No. 8,227,835.

(51) Int. Cl.
*H01L 21/8249* (2006.01)
*H01L 21/331* (2006.01)

(52) U.S. Cl.
USPC .......................................... 438/235; 438/309

(58) Field of Classification Search
USPC ......... 438/205, 235, 309, 312, 313, 317, 340, 438/350; 257/E21.371, E21.387, E29.033, 257/E29.188, E29.189
See application file for complete search history.

(56) References Cited

U.S. PATENT DOCUMENTS 5,155,561 A * 10/1992 Bozler et al. .................. 257/773
7,071,500 B2 * 7/2006 Miura et al. .................. 257/197

* cited by examiner

*Primary Examiner* — Hung Vu

(57) ABSTRACT

One embodiment of an electrostatic protection diode in an integrated circuit includes a base area having at least two bends therein.

5 Claims, 3 Drawing Sheets

METHOD OF MANUFACTURING AN ELECTROSTATIC PROTECTION DEVICE

This application is a divisional of U.S. patent application Ser. No. 10/931,495, filed on Aug. 31, 2004 now U.S. Pat. No. 8,227,835.

BACKGROUND

Integrated circuits (IC) may be damaged by electrostatic discharge (ESD) events. Heterojunction bipolar transistor (HBT) diodes may be used in ICs as electrostatic protection devices to limit voltage surges during such ESD events.

DETAILED DESCRIPTION OF THE DRAWINGS

Figure 1:
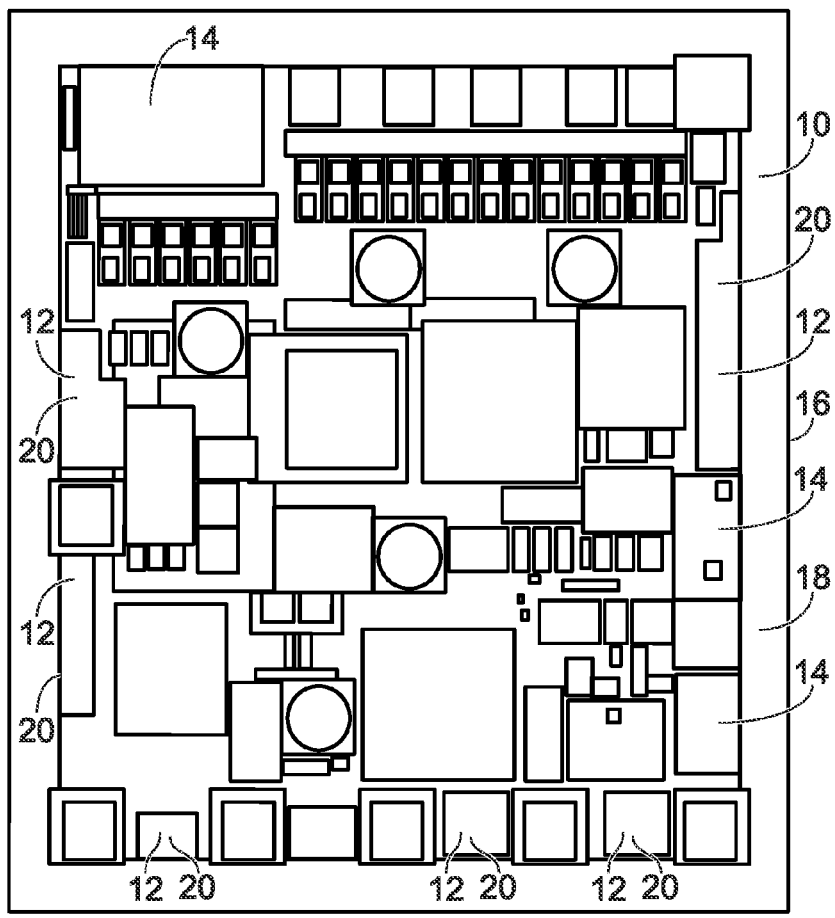
FIG. 1 is a schematic view of one embodiment of an integrated circuit that may include one embodiment of an electrostatic protection device of the present invention.

FIG. 1 is a schematic view of one embodiment of an integrated circuit 10 that may include one embodiment of an electrostatic protection device 12 of the present invention. In the embodiment shown, integrated circuit 10 may comprise a power amplifier. It may be desirable to manufacture circuit 10 in as small a size as possible so as to reduce the manufacturing cost, and/or to increase the speed of the circuit. Accordingly, it may be desirable to reduce the size of discrete devices on circuit 10.

In the embodiment shown, electrostatic protection device 12 may comprise a plurality of discrete electrostatic protection devices 12, such as a plurality of diodes. The diodes may comprise "npn" transistors manufactured by a gallium arsenide (GaAs) process and connected as a diode. However, other types of electrostatic protection devices, and/or other types of manufacturing processes, may also be utilized in other applications of the present invention. Integrated circuit 10 may comprise other discrete devices 14, as will be understood by those skilled in the art.

Integrated circuit 10 may comprise a perimeter 16 that may define a surface area 18, which may also be referred to as a footprint of the particular structural element. Each device 12 may define an individual surface area 20 of that particular device. In one embodiment, the individual surface areas 20 of each of devices 12 may define a total electrostatic protection device surface area that may comprise less than 5% of the surface area 18 of integrated circuit 10. In yet another embodiment, the individual surface areas 20 of each of devices 12 may define a total electrostatic protection device surface area that may comprise 2.5% or less of the surface area 18 of integrated circuit 10. Decreasing the total surface area of devices 12 may be desirable in that it may allow circuit 10 to be manufactured in a reduced size, thereby decreasing manufacturing costs of circuit 10.

Figure 2:
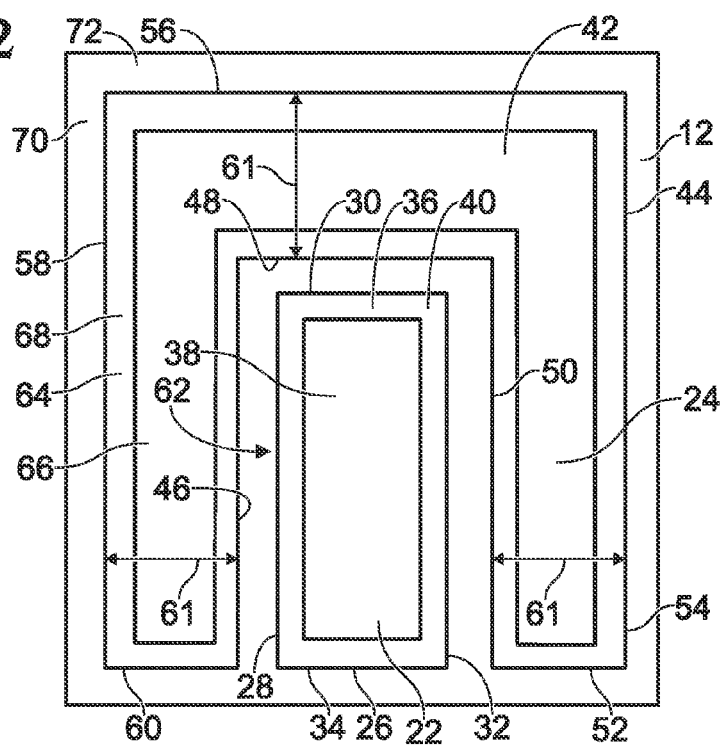
FIG. 2 is a top view of one embodiment of an electrostatic protection device.

FIG. 2 is a top view of one embodiment of an electrostatic protection device 12. In this embodiment, device 12 may comprise a collector contact 22 and a base area 24, which in one embodiment may comprise a base mesa. Collector contact 22 may define a generally rectangular shape that may define a perimeter 26 defined by first, second, third and fourth sides 28, 30, 32 and 34. Perimeter 26 may define a surface area 36 of collector contact 22. A contact via 38 may be positioned on top of collector contact 22 such that only an edge region 40 of collector contact 22 may be visible in this view, extending outwardly from contact via 38. Contact via 38 may be utilized to allow connection to collector contact 22 by a connection wire (not shown), a bump (not shown) or other connection structure.

Base area 24 may define a generally U type shape, which may alternatively be described as a C type shape, a hairpin type shape, or a shape having at least two bends or turns 42 therein. Base area 24 may define a perimeter 44 defined, in the particular embodiment shown, by first, second, third, fourth, fifth, sixth, seventh, and eighth sides 46, 48, 50, 52, 54, 56, 58 and 60. In the embodiment shown, U shaped base area 24 may partially enclose or partially surround collector contact 22 such that collector contact 22 may be positioned within an interior region 62 of base area 24. In particular, first, second and third sides 46, 48 and 50 of base area 24 may be positioned adjacent first, second and third sides 28, 30 and 32 of collector contact 22 such that collector contact 22 is positioned within bends 42 of base area 24. Perimeter 44 may define a surface area 64 of base area 24. A base contact 66 may be positioned on top of base area 24 such that only an edge region 68 of base area 24 may be visible in this view, extending outwardly from base area 64. Base contact 66 may be utilized to allow connection to base area 24 by a connection wire (not shown), a bump (not shown) or other connection structure.

In the embodiment shown, first, second, third and fourth sides 28, 30, 32 and 34 of collector contact 22 may have dimensions of approximately 10.5 micrometers (µm), 5 µm, 10.5 µm, and 5 µm, respectively. Accordingly, perimeter 26 of collector contact 22 may be approximately 31 µm and surface area 36 may be approximately 52.5 µm². In the embodiment shown, first, second, third, fourth, fifth, sixth, seventh, and eighth sides 46, 48, 50, 52, 54, 56, 58 and 60 of base area 24 may have dimensions of approximately 11.5 µm, 7 µm, 11.5 µm, 5 µm, 16.5 µm, 17 µm, 16.5 µm, and 5 µm, respectively. Accordingly, perimeter 44 of base area 24 may be approximately 90 µm and surface area 64 may be approximately 200 µm². Accordingly, base area 24 may define a width 61 of at most 10 µm, and more particularly, approximately 5 µm. Collector contact 22 and base area 24 may both be positioned within an isolation area 70 that may define a surface area 72 of approximately 350 µm². Device 12, therefore, may define an isolation region surface area 70 that is at most double the size of the surface area 64 of said base area 24. Moreover, device 12 may define a base area 24 perimeter 44 that is greater than the perimeter 26 of collector contact 22. Furthermore, base area 24 may define surface area 64 and perimeter 44, wherein a ratio of perimeter 44 in µm to surface area 64 in µm² defines a ratio of at least 0.45 µm⁻¹. In this embodiment, collector contact 22 defines perimeter 26, base area 24 defines perimeter 44, and perimeter 44 of said base area 24 may be greater than perimeter 26 of collector contact 22.

In another embodiment, first, second, third and fourth sides 28, 30, 32 and 34 of collector contact 22 may have dimensions of approximately 20.5 μm, 5 μm, 20.5 μm, and 5 μm, respectively. Accordingly, perimeter 26 of collector contact 22 may be approximately 51 μm and surface area 36 may be approximately 102.5 μm². In this embodiment, first, second, third, fourth, fifth, sixth, seventh, and eighth sides 46, 48, 50, 52, 54, 56, 58 and 60 of base area 24 may have dimensions of approximately 21.5 μm, 7 μm, 21.5 μm, 5 μm, 26.5 μm, 17 μm, 26.6 μm, and 5 μm, respectively. Accordingly, perimeter 44 of base area 24 may be approximately 130 μm and surface area 64 may be approximately 300 μm². Collector contact 22 and base area 24 may both be positioned within isolation area 70 that may define surface area 72 of approximately 540 μm². In this embodiment, base area 24 may define surface area 64 and perimeter 44, wherein a ratio of perimeter 44 in μm to surface area 64 in μm² defines a ratio of at least 0.433 μm$^{-1}$.

In another embodiment, first, second, third and fourth sides 28, 30, 32 and 34 of collector contact 22 may have dimensions of approximately 30.5 μm, 5 μm, 30.5 μm, and 5 μm, respectively. Accordingly, perimeter 26 of collector contact 22 may be approximately 71 μm and surface area 36 may be approximately 152.5 μm². In this embodiment, first, second, third, fourth, fifth, sixth, seventh, and eighth sides 46, 48, 50, 52, 54, 56, 58 and 60 of base area 24 may have dimensions of approximately 31.5 μm, 7 μm, 31.5 μm, 5 μm, 36.5 μm, 17 μm, 36.5, and 5 μm, respectively. Accordingly, perimeter 44 of base area 24 may be approximately 170 μm and surface area 64 may be approximately 400 μm². Collector contact 22 and base area 24 may both be positioned within isolation area 70 that may define surface area 72 of approximately 730 μm². In this embodiment, base area 24 may define surface area 64 and perimeter 44, wherein a ratio of perimeter 44 in μm to surface area 64 in μm² defines a ratio of at least 0.465 μm$^{-1}$.

It is believed that the relatively narrow width 61 of base area 24 contributes to its efficient operation and remarkably high breakdown current, approximately 3 Amperes (A) for a base area 24 having a surface area 64 of approximately 400 μm² or less. In particular, edge region 68 of base area 24 is believed to be the path of least resistance for regulating and channeling current to collector contact 22. Accordingly, it is believed that an interior or central region of the base area is not utilized when the base area is manufactured having a relatively wide width, i.e., a width of more than 10 μm. By providing a base area having a relatively narrow width 61, i.e., approximately 10 μm or less, the base area has a relatively large perimeter to surface area ratio such that the entire base area is used efficiently as a regulator and a central region of the base area is not under utilized or unused. In other words, base area 24 of the present invention, having a hairpin type shape, has a relatively large edge region such that heat is efficiently dissipated, resulting in a relatively high breakdown current of the device.

Figure 3:
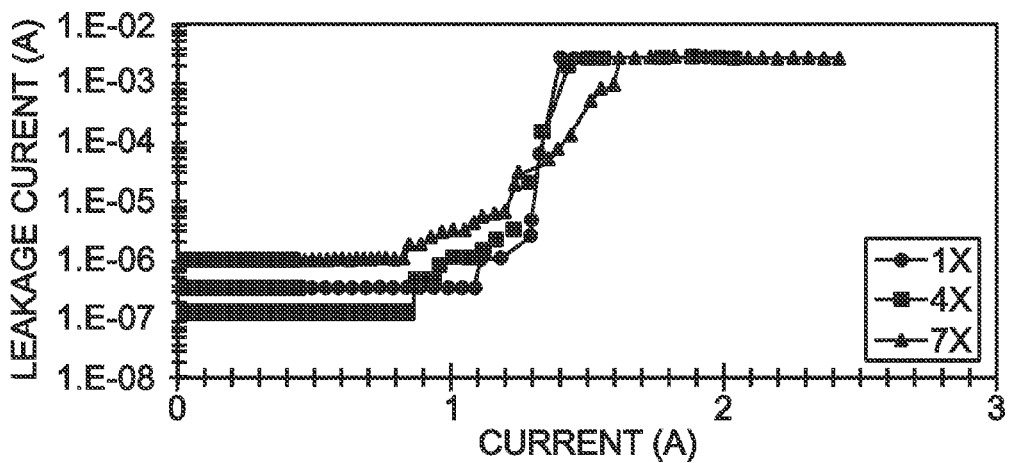
FIG. 3 is a graph of leakage current versus current for series chains of 1, 4 and 7 electrostatic protection devices, each device having a base area surface area of approximately 200 µm².

FIG. 3 is a graph of leakage current versus current for series chains of 1, 4 and 7 electrostatic protection devices of the present invention, each device having a base area surface area 64 (see FIG. 2) of approximately 200 μm² and an isolation surface area 70 of approximately 360 μm². As shown in the graph, one electrostatic protection device 12 (see FIG. 2), a series chain of four devices 12, and a series chain of seven devices 12, each breakdown at a current of approximately 1 A. At currents higher than approximately 1 A, the leakage current of the devices increases beyond an acceptable level of approximately 1E-06 A. Accordingly, the base area defines a surface area of at most 205 μm² and defines a breakdown current of at least 0.8 A. Moreover, the device defines an isolation area of at most 360 μm² and a breakdown current of at least 0.8 A. The device also defines a surface area of at most 205 μm² and a perimeter of at least 90 μm. Prior art electrostatic protection devices having a base area that is approximately rectangularly shaped with a base area surface area of approximately 200 μm² and an isolation surface area of approximately 616 μm² may have a breakdown current of approximately 0.9 A. The electrostatic protection device of the current invention, therefore, may have a higher breakdown current than prior art devices yet require an isolation surface area that is approximately 60% of that of the prior art devices or approximately 40% smaller.

Figure 4:
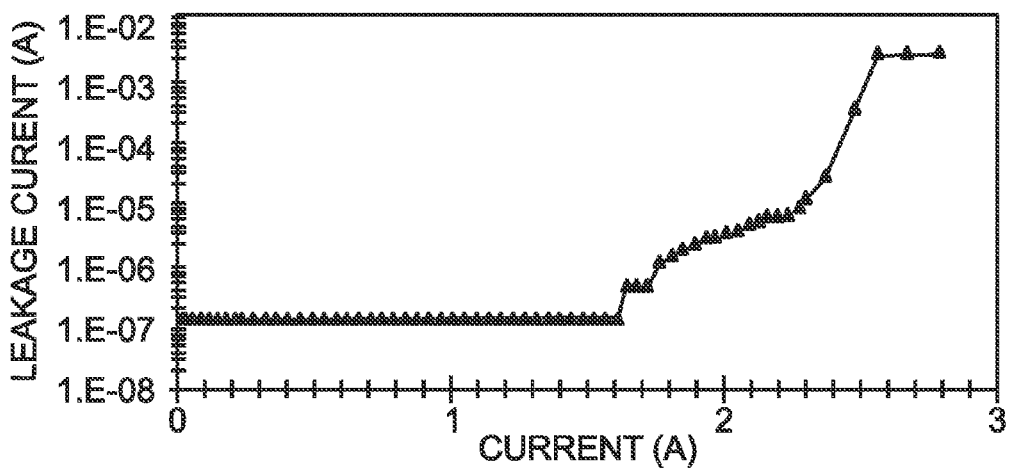
FIG. 4 is a graph of leakage current versus current for a series chain of 4 electrostatic protection devices, each device having a base area surface area of approximately 300 µm².

FIG. 4a is graph of leakage current versus current for a series chain of four electrostatic protection devices of the present invention, each device having a base area surface area 64 of approximately 300 μm² and an isolation surface area 70 of approximately 540 μm². As shown in the graph, a series chain of four devices 12 breaks down at a current of approximately 1.6 A. At currents higher than approximately 1.7 A, the leakage current of the devices increases beyond an acceptable level of approximately 1E-06 A. Accordingly, the base area defines a surface area of at most 305 μm² and defines a breakdown current of at least 1.6 A. Moreover, the device defines an isolation area of at most 560 μm² and a breakdown current of at least 1.6 A. The device also defines a surface area of at most 305 μm² and a perimeter of at least 130 μm. Prior art electrostatic protection devices having a base area that is approximately rectangularly shaped with a base area surface area of approximately 300 μm² and an isolation surface area of approximately 812 μm² may have a breakdown current of approximately 0.9 A. The electrostatic protection device of the current invention, therefore, may have a higher breakdown current than prior art devices yet require an isolation surface area that is approximately 70% of that of the prior art devices or approximately 30% smaller.

Figure 5:
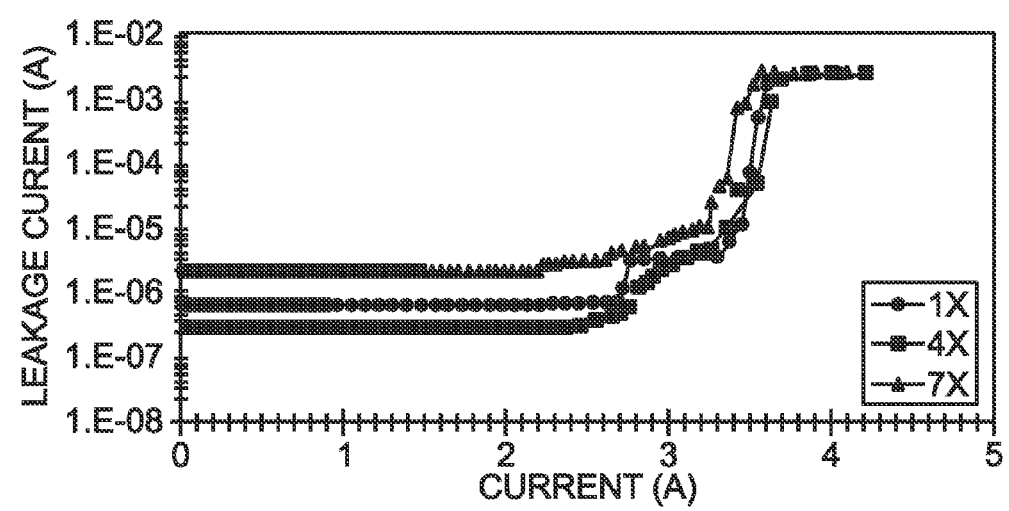
FIG. 5 is a graph of leakage current versus current for series chains of 1, 4 and 7 electrostatic protection devices, each device having a base area surface area of approximately 400 µm².

FIG. 5 is a graph of leakage current versus current for series chains of 1, 4 and 7 electrostatic protection devices of the present invention, having a base area surface area 64 of approximately 400 μm² and an isolation surface area 70 of approximately 730 μm². As shown in the graph, one electrostatic protection device 12 (see FIG. 2), a series chain of four devices 12, and a series chain of seven devices 12, each breakdown at a current of approximately 3 A. At currents higher than approximately 3 A, the leakage current of the devices increases beyond an acceptable level of approximately 1E-06 A. Accordingly, the base area defines a surface area 64 of at most 405 μm² and defines a breakdown current of at least 2.7 A. Moreover, the device defines an isolation area of at most 770 μm² and a breakdown current of at least 2.7 A. The device also defines a surface area of at most 405 μm² and a perimeter of at least 170 μm. Prior art electrostatic protection devices having a base area that is approximately rectangularly shaped with a base area surface area of approximately 400 μm² and an isolation surface area of approximately 1036 μm² may have a breakdown current of approximately 0.9 A. The electrostatic protection device of the current invention, therefore, may have a higher breakdown current than prior art devices yet require an isolation surface area that is approximately 74% of that of the prior art devices or approximately 26% smaller. Moreover, the electrostatic protection device 12 having a base area surface area 64 of approximately 400 μm² appears to provide electrostatic protection for currents up to 3 A, a desirable upper threshold current for power amplifier applications.

Figure 6:
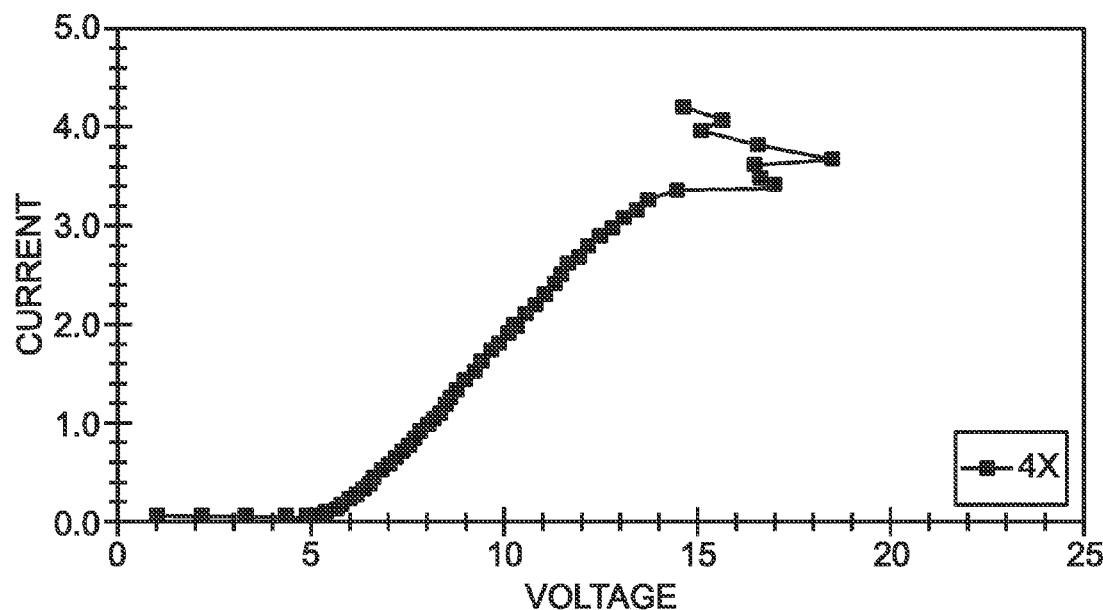
FIG. 6 is a graph of current versus voltage for a series chain of 4 electrostatic protection devices, each device having a base area surface area of approximately 400 µm².

FIG. 6 is a graph of current versus voltage for a series chain of 4 electrostatic protection devices 12 (see FIG. 2) of the present invention. The graph shows that the current versus voltage relationship is essentially linear up to approximately 3 A, which is a desirable upper threshold current for power amplifier applications. Accordingly, the devices 12 of the present invention exhibit predictable behavior, thereby simplifying circuit design and use.

Figure 7:
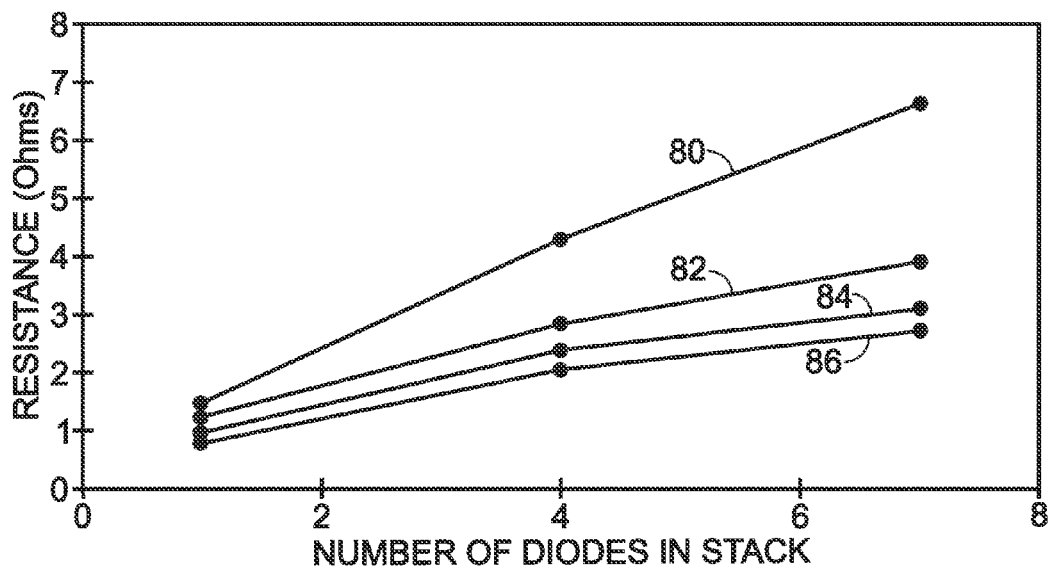
FIG. 7 is a graph of resistance versus a number of electrostatic protection devices in series.

FIG. 7 is a graph of resistance in ohms versus a number of electrostatic protection devices in series. Line 80 represents devices 12 having a U shape and a base area surface area 64 of approximately 200 μm². Line 82 represents prior art electrostatic protection devices having a rectangular shape and a base area surface area of approximately 200 μm². Line 84 represents devices 12 having a U shape and a base area surface area 64 of approximately 400 μm². Line 86 represents prior art electrostatic protection devices having a rectangular shape and a base area surface area of approximately 400 μm². This graph shows that the electrostatic protection devices 12 of the present invention exhibit a linear resistance relationship when a plurality of devices are arranged in series. In other words, increasing the number of devices in series linearly increases the resistance value of the series string. Accordingly, the devices 12 of the present invention exhibit predictable behavior, thereby simplifying circuit design and use.

A method of manufacturing one embodiment of an electrostatic protection device 12 may comprise depositing a collector contact 22 and defining a base area 24 that at least partially surrounds the collector contact. Depositing collector contact 22 may comprise depositing a rectangular shaped collector contact, and defining base area 24 may comprise etching a base area at least partially surrounding the rectangular shaped collector contact.

Other variations and modifications of the concepts described herein may be utilized and fall within the scope of the claims below.

We claim:

1. A method of manufacturing an electrostatic protection device, comprising:
   depositing a collector contact; and
   defining a base area that at least partially surrounds said collector contact, wherein said base area channels current to said collector contact completely along an edge that at least partially surrounds said collector contact, wherein said base area defines a U shape having an interior edge and wherein said base area channels current to said collector contact completely along said interior edge of said U shape that at least partially surrounds said collector contact.

2. A method of manufacturing an electrostatic protection device, comprising:
   depositing a collector contact; and
   defining a base area that at least partially surrounds said collector contact, wherein said base area channels current to said collector contact completely along an edge that at least partially surrounds said collector contact, wherein said collector contact defines a rectangular shape and wherein said base area channels current to said collector contact completely along three sides of said rectangular shape of said collector contact.

3. A method of manufacturing an electrostatic protection diode, comprising:
   defining a base that defines a U shape; and
   defining a collector contact,
   wherein said base channels current to said collector contact through an entire length of a lower, inner edge of said U shape.

4. A method according to claim 3 wherein said base at least partially surrounds said collector contact.

5. A method according to claim 3 wherein said base defines a width of at most 10 micrometers.

* * * * *